United States Patent
Imai et al.

(10) Patent No.: US 6,549,763 B1
(45) Date of Patent: Apr. 15, 2003

(54) RECEIVING APPARATUS AND METHOD

(75) Inventors: Tadashi Imai, Chiba (JP); Kozo Kobayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/568,297

(22) Filed: May 9, 2000

(30) Foreign Application Priority Data

May 11, 1999 (JP) .............................................. 11-129917

(51) Int. Cl.⁷ .............................. H04B 1/16; H04L 27/06
(52) U.S. Cl. ................................ 455/249.1; 455/232.1; 455/234.1; 455/234.2; 455/324; 375/322; 375/324; 375/328; 375/345; 375/346
(58) Field of Search .................................. 375/322, 324, 375/328, 345, 346; 455/249.1, 232.1, 234.1, 234.2, 324

(56) References Cited

U.S. PATENT DOCUMENTS

| | | | | | |
|---|---|---|---|---|---|
| 4,061,041 A | * | 12/1977 | Fletcher et al. | ................ | 330/52 |
| 4,843,637 A | * | 6/1989 | Shimura et al. | ......... | 455/200.1 |
| 5,870,439 A | * | 2/1999 | Ben-Efraim et al. | ........ | 375/346 |
| 6,006,066 A | * | 12/1999 | Krimmel | .................... | 725/125 |
| 6,356,736 B2 | * | 3/2002 | Tomasz et al. | ............. | 375/345 |
| 6,434,374 B1 | * | 8/2002 | Muterspaugh | ........... | 455/234.1 |

FOREIGN PATENT DOCUMENTS

| | | |
|---|---|---|
| DE | 37 01 134 | 7/1988 |
| EP | 0 865 165 | 9/1998 |
| WO | WO 00 13306 | 3/2000 |

* cited by examiner

Primary Examiner—Vivian Chin
Assistant Examiner—Kamran Afshar
(74) Attorney, Agent, or Firm—Frommer Lawrence & Haug LLP; William S. Frommer; Bruno Polito

(57) ABSTRACT

A receiving apparatus and method which can prevent second order harmonic interference and beat interference in a direct orthogonal detector is disclosed. When a control signal of the high level is inputted to a control terminal, then a first high frequency switch diode is turned on and a second high frequency switch diode is turned off. In this instance, a filter circuit functions as a low-pass filter. When a control signal of a low level is inputted to the control terminal, then the first high frequency switch diode is turned off and the second high frequency switch diode is turned on. In this instance, the filter circuit functions as a high-pass filter.

5 Claims, 5 Drawing Sheets

F I G. I

LPF

HPF

RECEIVING APPARATUS AND METHOD

BACKGROUND OF THE INVENTION

This invention relates to a receiving apparatus and method, and more particularly to a receiving apparatus and method which can be suitably used to receive and directly orthogonally detect a digital modulated wave.

A broadcasting signal of a digital satellite broadcast such as, for example, the SKY PerfecTV (trademark) is a signal digitally modulated using the QPSK (Quadrature Phase Shift Keying). Accordingly, a receiving apparatus for receiving a digital modulated wave of the broadcasting signal includes an orthogonal detector which detects an I-component signal and a Q-component signal of the digital modulated wave.

FIG. 1 shows an example of a construction of a conventional orthogonal detector. Referring to FIG. 1, in the orthogonal detector shown, a digital modulated wave received by an antenna (not shown) and frequency converted into a signal of 950 MHz to 2,150 MHz in the L band is inputted as an input signal to an input terminal 1 of a preamplifier (AMP) 2. The preamplifier 2 amplifies the input signal and outputs a resulting signal to a variably controlled band-pass filter (BPF) 3. The variably controlled band-pass filter 3 removes an image interfering frequency included in the input signal thereto from the preamplifier 2 in response to a channel selection voltage from a low-pass filter built in a PLL (Phase Lock Loop) circuit 23, and outputs a resulting signal to an attenuator (ATT) 4. The image interfering frequency signifies a signal generated by heterodyne detection of a mixer 6 and having a frequency equal to an (oscillation frequency F1 of a local oscillator 22)+ (intermediate frequency (480 MHz) outputted from the mixer 6).

The attenuator 4 limits the level of the signal from the variably controlled band-pass filter 3 to a fixed level based on an AGC (Automatic Gain Control) signal inputted thereto from the outside of the orthogonal detector, and outputs a resulting signal to an amplifier 5. The amplifier 5 amplifies the signal from the attenuator 4 and outputs the amplified signal to the mixer 6.

The mixer 6 multiplies the signal inputted thereto from the amplifier 5 by the signal inputted thereto from the local oscillator 22 to obtain an intermediate frequency signal (480 MHz) and outputs the intermediate frequency signal to an IF amplifier 7. The frequency (oscillation frequency) LF of the signal oscillated by the local oscillator 22 is determined with a control signal for controlling the dividing ratio of the PLL circuit 23 in response to a channel selection operation of a user so that the following expression (1) may be satisfied:

$$\text{oscillation frequency } LF = \text{reception frequency } Fin + \text{intermediate frequency } IF \text{ (480 MHz)} \quad (1)$$

In particular, output pulses of the voltage controlled oscillator built in the PLL circuit 23 corresponding to the control signal are integrated by a low-pass filter built in the PLL circuit 23 so that they are converted into a dc voltage. The dc voltage is supplied as a channel selection voltage to a resonance circuit (TANK) 24 and varies the voltage controlled variable capacitance of the resonance circuit 24 thereby to control the frequency of the signal to be oscillated by the local oscillator 22. Further, the channel selection voltage from the low-pass filter of the PLL circuit 23 is supplied also to the band-pass filter 3.

The IF amplifier 7 amplifies the intermediate frequency inputted thereto from the mixer 6 and outputs the amplified intermediate frequency to a SAW filter 8. The SAW filter 8 limits the frequency band of the intermediate frequency inputted thereto from the IF amplifier 7 and outputs a resulting signal to an IF amplifier 9. The IF amplifier 9 corrects amplitude loss of the SAW filter 8 and outputs a resulting signal to an attenuator 10. The attenuator 10 limits the level of the signal from the IF amplifier 9 to a fixed level based on the AGC signal and outputs a resulting signal to a pair of mixers 11 and 12.

The mixer 11 multiplies the signal from the attenuator 10 by a signal outputted from an oscillator 18 which is controlled by a SAW oscillator 17, and outputs a resulting signal to a baseband amplifier 13. The baseband amplifier 13 amplifies the signal from the mixer 11 and outputs the amplified signal to a low-pass filter 15. The low-pass filter 15 attenuates, among signals inputted thereto from the base band amplifier 13, those signals of frequencies higher than the intermediate frequency band. The low-pass filter 15 outputs a resulting signal as an I-(In-Phase) component signal from an output terminal 20.

The mixer 12 multiplies the signal from the attenuator 10 by the signal from the oscillator 18 having a phase shifted by 90 degrees by a 90° phase shifter 19 and outputs a resulting signal to a baseband amplifier 14. The baseband amplifier 14 amplifies the signal from the mixer 12 and outputs the amplified signal to a low-pass filter 16. The low-pass filter 16 attenuates, among signals inputted thereto from the baseband amplifier 14, those signals of frequencies higher than the intermediate frequency band. The low-pass filter 16 outputs a resulting signal as a Q-(Quadrature-Phase) component signal from another output terminal 21.

It is to be noted that, for the I-component and Q-component signals outputted from the orthogonal detector, Viterbi decoding, error correction processing, decoding processing and so forth are thereafter performed successively.

While the orthogonal detector shown in FIG. 1 produces an intermediate frequency from an input signal of the L band and detects I-component and Q-component signals from the intermediate frequency signal, an orthogonal detector of the direct detection type has been developed in recent years. The orthogonal detector of the direct detection type is simplified in circuit construction such that it detects I-component and Q-component signals directly from an input signal of the L band.

FIG. 2 shows an example of a construction of an orthogonal detector of the direct detection type. It is to be noted that the orthogonal detector of the direct detection type is hereinafter referred to simply as direct orthogonal detector.

Referring to FIG. 2, in the direct orthogonal detector shown, an input signal of the L band amplified by a preamplifier 2 is inputted to an attenuator 4. The attenuator 4 limits the level of the input signal of the L band from the preamplifier 2 to a fixed level based on an AGC signal inputted thereto from the outside of the direct orthogonal detector and outputs a resulting signal to an amplifier 5. The amplifier 5 amplifies the input signal of the L band from the attenuator 4 and outputs a resulting signal to a pair of mixers 31 and 32.

The mixer 31 multiplies the input signal of the L band from the amplifier 5 by a signal outputted from an oscillator 37 and outputs a resulting signal to a variable gain amplifier 33. The variable gain amplifier 33 limits the level of the signal from the mixer 31 in response to the AGC signal and outputs a resulting signal to a low-pass filter 35. The low-pass filter 35 attenuates, among signals inputted thereto from the variable gain amplifier 33, those signals of frequencies higher than an intermediate frequency. The low-pass filter 35 outputs a resulting signal as an I-component signal from an output terminal 20.

The mixer 32 multiplies the input signal of the L band from the amplifier 5 by the signal from the oscillator 37 having a phase shifted by 90 degrees by a 90° phase shifter 40 and outputs a resulting signal to a variable gain amplifier 34. The variable gain amplifier 34 limits the level of the signal from the mixer 32 in response to the AGC signal and outputs a resulting signal to a low-pass filter 36. The low-pass filter 36 attenuates, among signals inputted thereto from the variable gain amplifier 34, those signals of frequencies higher than the intermediate frequency. The low-pass filter 36 outputs a resulting signal as a Q-component signal from another output terminal 21. It is to be noted that the variable gain amplifiers 33 and 34 are provided to make up for limitation to the signal level which is insufficient where it is obtained only by the processing of the attenuator 4 and have a control width similar to that of the attenuator 4.

The oscillator 37 generates a signal of a predetermined frequency in accordance with a control signal for controlling the dividing ratio of a PLL circuit 38 in response to a channel selection operation by a user. In particular, output pulses of a voltage controlled oscillator built in the PLL circuit 38 corresponding to the control signal are integrated by a low-pass filter also which is built in the PLL circuit 38 so that they are converted into a dc voltage. Then, the dc voltage is supplied as a channel selection voltage to a resonance circuit 39 and varies the voltage controlled variable capacitance of the resonance circuit 39 thereby to control the frequency of the signal to be oscillated by the oscillator 37.

In this manner, since the direct orthogonal detector of FIG. 2 does not execute heterodyne detection (which corresponds to the processing of the mixer 6 of FIG. 1), image interference does not occur. Accordingly, since an image interfering frequency need not be removed, the band-pass filter 3 of FIG. 1 can be omitted from the direct orthogonal detector. Further, since several elements from the IF amplifier 7 to the attenuator 10 and so forth of FIG. 1 can be omitted from the direct orthogonal detector, the direct orthogonal detector is simplified in circuit scale and reduced in cost when compared with the orthogonal detector shown in FIG. 1.

An input signal to the direct orthogonal detector shown in FIG. 2 has a broad frequency range (950 MHz to 2,150 MHz). This gives rise to the following problem.

In particular, if an input signal to the preamplifier 2 is a single sinusoidal signal as given by the following expression (1), $$Vi=(V \cos \omega t) \quad (1)$$

since the input/output nonlinear characteristic of the preamplifier 2 is such as given by the following expression (2), $$V0=a0+a1Vi+a2Vi2+a3Vi3 \quad (2)$$

a second order harmonic of the input signal interferes with the reception band as indicated by the following expression (3), $$V0=a0+a1V \cos \omega t+a2(V \cos \omega t)2+a3(V \cos \omega t)3 =a0+a1V \cos \omega t+a2V2(1+\cos 2\omega t)/2+ \quad (3)$$

For example, when a signal of 1,900 MHz from input signals is to be received, a signal Vi of 950 MHz included in the input signals is amplified by the preamplifier 2, whereupon a higher harmonic component (cos 2ωt) of a frequency of 1,900 MHz equal to twice that of the signal Vi is generated and interferes with the reception band.

Further, in the mixers 31 and 32, beat interference of a frequency Fb equal to the difference between a value equal to twice the frequency Fd of the signal to be received and the oscillation frequency LF of the signal from the oscillator 37 as given by the following expression (4) occurs:

$$Fb=2Fd-LF \quad (4)$$

Where the frequency band of the input signal ranges from 950 MHz to 2,150 MHz as described above, the condition that the second order harmonic makes interference with reception is satisfied when one half the reception frequency Fd is 950 MHz or more as given by the following expression (5), $$950 \text{ MHz} \leq Fd/2 \quad (5)$$

and the condition that the beat interference occurs is that twice the reception frequency Fd is 2,150 MHz or less as given by the following expression (6), $$2Fd \leq 2,150 \text{ MHz} \quad (6)$$

Accordingly, when the reception frequency Fd satisfies the condition of the expression (5), that is, when the reception frequency Fd is 1,900 MHz to 2,150 MHz, it is necessary to attenuate a signal of a frequency (950 MHz to 1,075 MHz) equal to one half the reception frequency Fd. Meanwhile, when the reception frequency Fd satisfies the condition of the expression (6), that is, when the reception frequency Fd is 950 MHz to 1,075 MHz, it is necessary to attenuate a signal of a frequency (1,900 MHz to 2,150 MHz) equal to twice the reception frequency Fd.

However, it is difficult to design a circuit by which the frequency band to be attenuated can be varied in response to a variation of a reception frequency as described above because the frequency range (950 MHz to 2,150 MHz) of the inputted signal is a broad band. Accordingly, there is a problem that it is difficult to prevent second order harmonic interference and beat interference in a direct orthogonal detector.

SUMMARY OF THE INVENTION

It is an object of the present invention to provide a receiving apparatus and method which can prevent second order harmonic interference and beat interference in a direct orthogonal detector.

In order to attain the object described above, according to an aspect of the present invention, there is provided a receiving apparatus for receiving and directly orthogonally detecting a digital modulated wave, including amplifying means for amplifying the digital modulated wave inputted thereto, attenuating means for attenuating, of the digital modulated wave amplified by the amplifying means, a signal of a frequency equal to twice a designated reception frequency or another signal of another frequency equal to one half the reception frequency, and detecting means for detecting an I-component signal and a Q-component signal from the digital modulated wave attenuated by the attenuating means.

According to another aspect of the present invention, there is provided a receiving method for a receiving apparatus for receiving and directly orthogonally detecting a digital modulated wave, including an amplifying step of amplifying the digital modulated wave inputted thereto, an attenuating step of attenuating, of the digital modulated wave amplified by the amplifying step, a signal of a frequency equal to twice a designated reception frequency or another signal of another frequency equal to one half the reception frequency, and a detecting step of detecting an I-component signal and a Q-component signal from the digital modulated wave attenuated by the attenuating step.

In the receiving apparatus and the receiving method, a digital modulated wave inputted is amplified, and from within the amplified digital modulated wave, a signal of a frequency equal to twice a designated reception frequency or a signal of another frequency equal to one half the reception frequency is attenuated. Then, an I-component signal and a Q-component signal are detected from the attenuated digital modulated wave.

Consequently, with the receiving apparatus and the receiving method, since a signal of a frequency equal to twice a designated reception frequency or a signal of another frequency equal to one half the reception frequency is attenuated, second order harmonic interference and beat interference can be prevented in a direct orthogonal detector.

The above and other objects, features and advantages of the present invention will become apparent from the following description and the appended claims, taken in conjunction with the accompanying drawings in which like parts or elements denoted by like reference symbols.

DESCRIPTION OF THE PREFERRED EMBODIMENT

Figure 1:
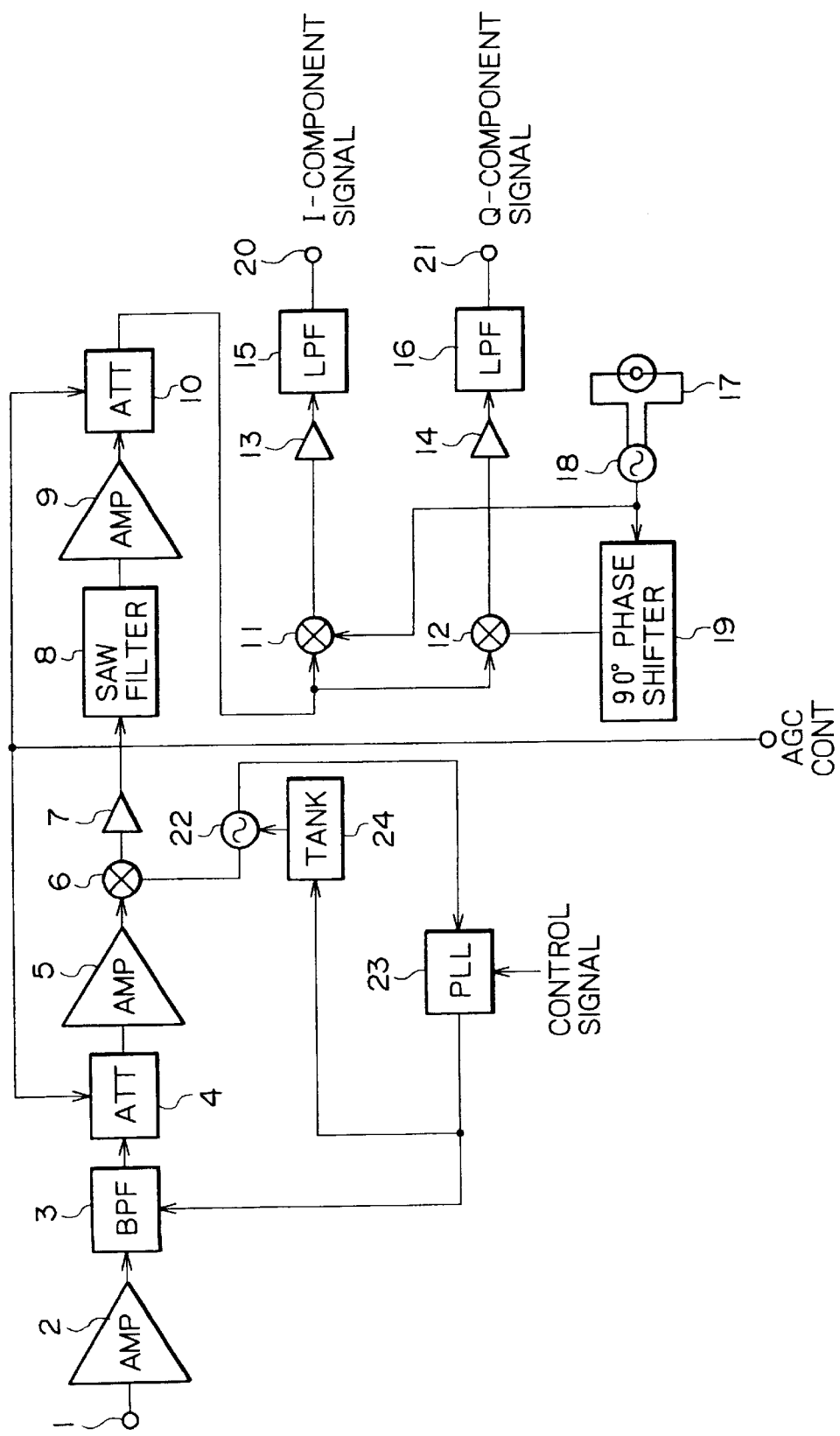
FIG. 1 is a block diagram showing a conventional orthogonal detector.
Figure 2:
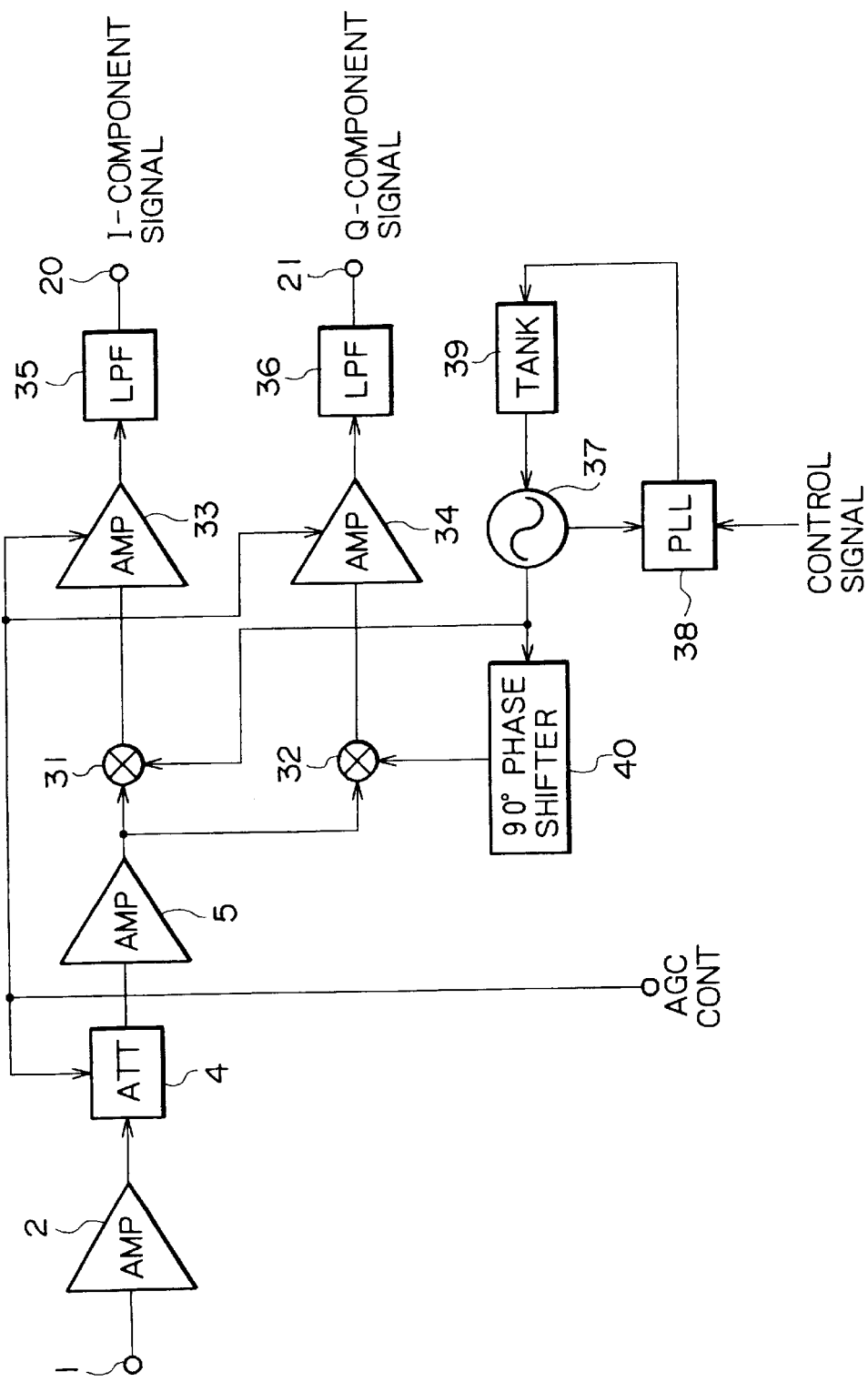
FIG. 2 is a block diagram showing a conventional direct orthogonal detector.
Figure 3:
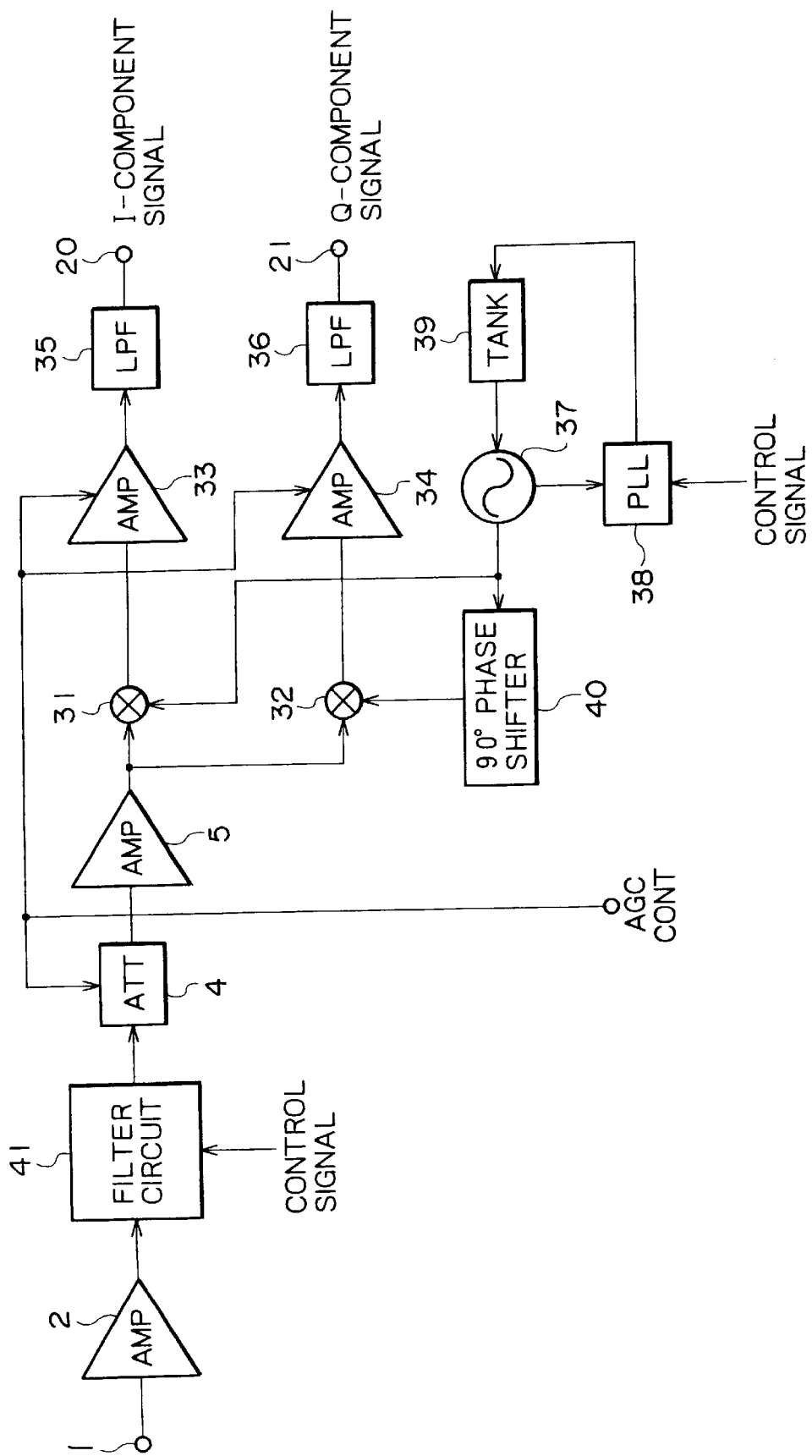
FIG. 3 is a block diagram showing a direct orthogonal detector to which the present invention is applied.

Referring to FIG. 3, there is shown a direct orthogonal detector to which the present invention is applied. The direct orthogonal detector shown is an improved apparatus based on the direct orthogonal detector described hereinabove with reference to FIG. 2. The direct orthogonal detector includes all of the components of the direct orthogonal detector of FIG. 2 but is different from the direct orthogonal detector of FIG. 2 only in that it additionally includes a filter circuit 41 interposed between the preamplifier 2 and the attenuator 4. It is to be noted that description of the common components is omitted herein to avoid redundancy.

Figure 4:
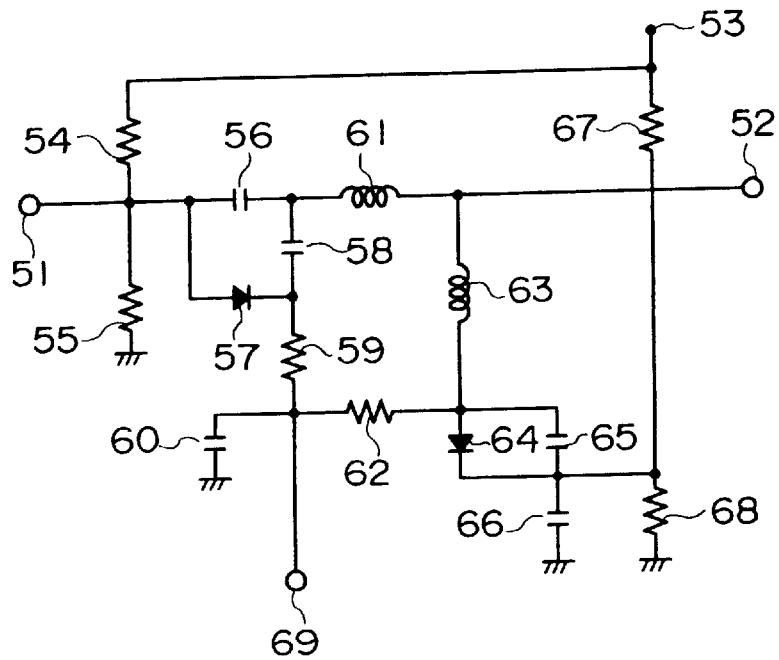
FIG. 4 is a circuit diagram showing an example of a detailed construction of a filter circuit shown in FIG. 3.

The filter circuit 41 is changed over to a high-pass filter or a low-pass filter in response to a control signal inputted thereto based on a channel selection operation by a user. FIG. 4 shows an example of a detailed construction of the filter circuit 41. Referring to FIG. 4, the filter circuit 41 has a terminal 51 to which an input signal (950 MHz to 2,150 MHz) from the preamplifier 2 is inputted. Another terminal 52 is connected to the attenuator 4. To a power supply terminal 53, a pair of bias resistors 54 and 55 for dividing a potential supplied thereto are connected in series. Also another pair of bias resistors 67 and 68 for dividing a potential supplied thereto are connected in series to the power supply terminal 53.

A high frequency switch diode 57 is connected at the anode thereof to a junction of the bias resistors 54 and 55 and connected at the cathode thereof to a control terminal 69 of the filter circuit 41 through a resistor 59. Another high frequency switch diode 64 is connected at the cathode thereof to a junction of the bias resistors 67 and 68 and connected at the anode thereof to the control terminal 69 through a resistor 62. Accordingly, when one of the high frequency switch diodes 57 and 64 is turned on in response to a potential of a control signal inputted to the control terminal 69, the other is turned off.

A capacitor 56 is connected at one end thereof to the terminal 51 and at the other end thereof to the terminal 52 through an inductor 61. Another capacitor 58 is connected at one end thereof to a junction of the capacitor 56 and the inductor 61 and connected at the other end thereof to the cathode of the high frequency switch diode 57. A further capacitor 60 is grounded at one end thereof and connected at the other end thereof to the control terminal 69. An inductor 63 is connected at one end thereof to a junction of the inductor 61 and the terminal 52 and connected at the other end thereof to a capacitor 65. One end of the capacitor 65 is grounded through a bypass capacitor 66.

It is to be noted that the capacitors 56 and 65 and the inductors 61 and 63 are suitably combined to form a high-pass filter or a low-pass filter of a high frequency band. The capacitors 58, 60 and 66 are bypass capacitors which have low impedances in the high frequency band.

Figure 5A:
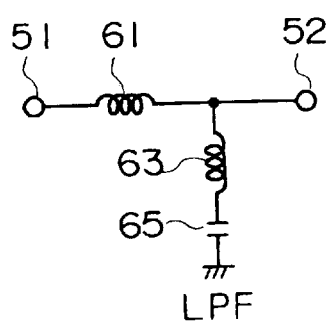
FIGS. 5A and 5B are circuit diagram illustrating different operations of the filter circuit of FIG. 4.

Subsequently, operation of the filter circuit 41 is described. If a control signal of the low level is inputted to the control terminal 69, then the high frequency switch diode 57 is turned on, and the high frequency switch diode 64 is turned off. In this instance, the high frequency switch diode 57 transmits a high frequency signal therethrough without attenuating the same. Consequently, the capacitor 56 is caused to apparently have a small capacitance by the series circuit of the high frequency switch diode 57 and the capacitor 58 and does not function as a filter. Meanwhile, the high frequency switch diode 64 is in a high impedance state and does not transmit a high frequency signal therethrough. As a result, the total capacitance of the capacitors 65 and 66 connected in series becomes substantially equal to that of the capacitor 65 from a capacitance ratio between them. If attention is paid to those elements which principally form the filter from the elements through which a high frequency passes by the operation described above, then they have such a construction as shown in FIG. 5A. As apparently seen from FIG. 5A, when the high frequency switch diode 57 is turned on and the high frequency switch diode 64 is turned off, the filter circuit 41 functions as a low-pass filter.

Figure 5B:
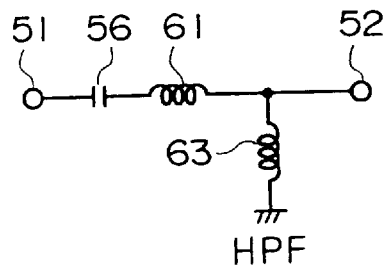

If a control signal of the high level is inputted to the control terminal 69, then the high frequency switch diode 57 is turned off and the high frequency switch diode 64 is turned on. In this instance, the high frequency switch diode 57 is in a high impedance state and does not transmit a high frequency signal therethrough. Meanwhile, the high frequency switch diode 64 transmits a high frequency signal therethrough without attenuating the same. Consequently, the capacitor 65 does not function as a filter. If attention is paid to those elements which principally form the filter from among the elements through which a high frequency passes as a result of the operation described above, then they have such a construction as shown in FIG. 5B. As apparently seen from FIG. 5B, when the high frequency switch diode 57 is turned off and the high frequency switch diode 64 is turned on, the filter circuit 41 functions as a highpass filter.

Figure 6:
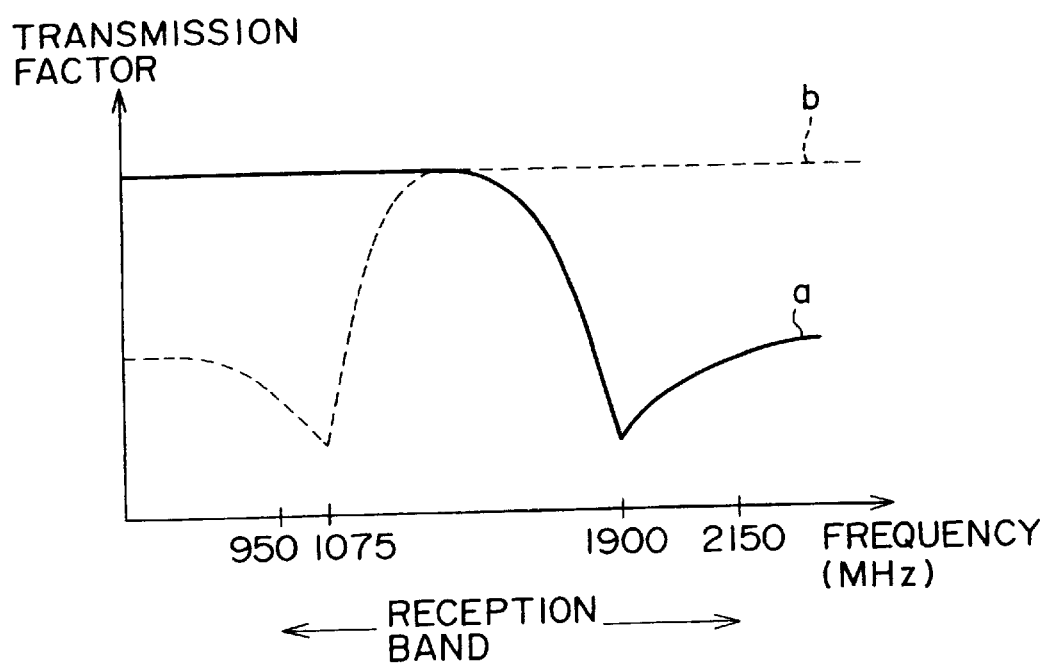
FIG. 6 is a diagram illustrating a characteristic in principle of the filter circuit of FIG. 4.

FIG. 6 illustrates a characteristic in principle when the filter circuit 41 functions as a low-pass filter or a high-pass filter. When the filter circuit 41 functions as a low-pass filter, it attenuates signals of a frequency band particularly higher than 1,900 MHz as indicated by a curve "a" of FIG. 6. On the other hand, when the filter circuit 41 functions as a high-pass filter, it attenuates signals of another frequency band particularly lower than 1,075 MHz as indicated by another curve "b" of FIG. 6.

Subsequently, a boundary of the reception frequency across which the filter circuit 41 is changed over to a low-pass filter or a high-pass filter is described. As described hereinabove, where the reception frequency Fd is within the range from 1,900 MHz to 2,150 MHz, it is necessary to change over the filter circuit 41 to a high-pass filter which can attenuate a signal of a frequency (950 MHz to 1,075 MHz) equal to one half the reception frequency Fd. On the other hand, when the reception frequency Fd is within the range from 950 MHz to 1,075 MHz, it is necessary to change over the filter circuit 41 to a low-pass filter which can attenuate a signal of another frequency (1,900 MHz to 2,150 MHz) equal to twice the reception frequency Fd. Further, when the reception frequency Fd is within the range from the 1,075 MHz to 1,900 MHz, since second order harmonic interference or beat interference does not occur in the frequency band (950 MHz to 2,150 MHz) of the input signal, the filter circuit 41 may be any one of a low-pass filter and a high-pass filter. Accordingly, an arbitrary frequency within the range from 1,075 MHz to 1,900 MHz may be used as a boundary such that, in order to receive a signal of a frequency lower than the boundary, the filter circuit 41 is changed over to a low-pass filter, but in order to receive another signal of another frequency higher than the frequency of the boundary, the filter circuit 41 is changed over to a high-pass filter.

It is to be noted that the characteristic of the filter circuit 41 is not limited to that shown in FIG. 6, but may be varied in response to a frequency band to be received, a characteristic of the preamplifier or the like.

Further, the filter circuit 41 may not be used as a low-pass filter or a high-pass filter, but may be used restrictively using only either one of the functions.

It is to be noted that the present invention can be applied to all electronic apparatus which orthogonally detect a digital modulated wave.

While a preferred embodiment of the present invention has been described using specific terms, such description is for illustrative purposes only, and it is to be understood that changes and variations may be made without departing from the spirit or scope of the following claims.

What is claimed is:

1. A receiving apparatus for receiving and directly orthogonally detecting a digital modulated wave, comprising:

filter means for selectively attenuating a signal component of said digital modulated wave having a frequency equal to twice a designated reception frequency or a signal component of said digital modulated wave having a frequency equal to one half said designated reception frequency, wherein the signal component to be attenuated is selected according to said designated reception frequency; and detecting means for detecting an I-component signal and a Q-component signal from the digital modulated wave attenuated by said filter means.

2. A receiving apparatus according to claim 1, wherein said filter means alternatively functions as-a low-pass filter or a high-pass filter in response to a control signal inputted thereto.

3. A receiving method for a receiving apparatus for receiving and directly orthogonally detecting a digital modulated wave, comprising the steps of:

selectively attenuating a signal component of said digital modulated wave having a frequency equal to twice a designated reception frequency or a signal component of said digital modulated wave having a frequency equal to one half said designated reception frequency, wherein the signal component to be attenuated is selected according to said designated reception frequency; and detecting an I-component signal and a Q-component signal from the digital modulated wave attenuated in said step of selectively attenuating.

4. A receiving apparatus according to claim 1, further comprising amplifying means for amplifying the digital modulated wave inputted thereto.

5. A receiving apparatus according to claim 2, wherein said filter means functions as a low-pass filter when a frequency equal to twice said designated reception frequency is within the reception frequency range of the apparatus, and said filter means functions as a high-pass filter when a frequency equal to one half said designated reception frequency is within the reception frequency range of the apparatus.

* * * * *